United States Patent [19]
Fujii et al.

[11] Patent Number: 5,868,948
[45] Date of Patent: Feb. 9, 1999

[54] METHOD FOR FABRICATING DIELECTRIC DEVICE

[75] Inventors: Satoru Fujii, Takatsuki; Ryoichi Takayama, Suita; Takeshi Kamada, Nara; Atsushi Tomozawa, Osaka, all of Japan

[73] Assignee: Matsushita Electric Industrial Co. Ltd., Osaka-Fu, Japan

[21] Appl. No.: 724,654

[22] Filed: Oct. 1, 1996

[30] Foreign Application Priority Data

Oct. 6, 1995 [JP] Japan .................................. 7-259762
Mar. 18, 1996 [JP] Japan .................................. 8-060515

[51] Int. Cl.$^6$ ...................................................... B44C 1/22
[52] U.S. Cl. ................................ 216/2; 216/13; 216/41; 216/67; 216/101
[58] Field of Search ................................. 216/2, 13, 24, 216/41, 67, 101, 108, 109

[56] References Cited

U.S. PATENT DOCUMENTS 4,759,823  7/1988  Asseianis et al. .
5,258,093  11/1993  Maniar .
5,262,392  11/1993  Hung et al. ........................... 216/101 X
5,413,667  5/1995  Fujii et al. ............................. 216/101 X

FOREIGN PATENT DOCUMENTS 52091397  8/1977  Japan .
61275724  12/1986  Japan .
02067726  3/1990  Japan .

OTHER PUBLICATIONS

S. Mancha; "Chemical Etching Of Thin PLZT"; Ferroelectrics, 1992, vol. 135, pp. 131–137.

*Primary Examiner*—William Powell
*Attorney, Agent, or Firm*—Panitch Schwarze Jacobs & Nadel, P.C.

[57] ABSTRACT

A method for fabricating a dielectric device including a capacitor, a pyroelectric infrared detector, and the like is disclosed. The method comprises the steps of etching a dielectric substance film formed on a substrate to form a predetermined pattern with an etchant comprised of hydrofluoric acid and an oxidizing agent, and removing residues resulting from the etching by treating the etched layer with a first treating solution containing a reducing agent and subsequently with a second treating solution containing an acid.

17 Claims, 13 Drawing Sheets

METHOD FOR FABRICATING DIELECTRIC DEVICE

BACKGROUND OF THE INVENTION

1. Field of the Invention

The present invention relates generally to a method for fabricating dielectric devices including ferroelectric devices applied to, for instance, capacitors, pyroelectric infrared detectors and the like, and particularly to a fine patterning technology of dielectric substances.

2. Description of the Prior Art

With the recent progress in the developments of non-volatile memory tips, microsensors, actuators and the like, importance of fine pattern etching technologies applied to dielectric substances represented by the ferroelectric substances have become increasing. Known fine pattern etching methods for Si-dielectric substances and electrode materials include dry processes such as reactive ion etching using a reactive or etching gas, sputter etching and the like, and wet processes such as chemical etching. Investigations have been made on the patterning of the ferroelectric substances represented by lead titanate ($PbTiO_3$), PZT (lead-zirconium titanate) and PLZT (lead-lanthanum-zirconium titanate), and electrode materials of noble metals such as Pt, Au, Pd and the like, or compounds thereof, by the reactive ion etching and sputter etching categorized as the dry processes.

The above-mentioned materials however have a low reactivity with the etching gas and thus demonstrate a low etch rate, and therefore there is a need to rise the temperature of a sample up to several hundred degree centigrade (M. R. Poor and C. B. Fleddermann: Journal of Applied Physics, 70 (6), p.3385–3387 (1991)).

On the other hand, the sputter etching uses accelerated argon ions or the like to cause a physical collision of the ions with a sample thereby to effect anisotropic etching. This results in a lesser role of chemical reaction and thus this method appears effective for the patterning of the ferroelectric substances.

Separate from this, an investigation is also conducted on the patterning of the ferroelectric substances represented by perovskite ceramics containing Pb by the chemical etching method as the wet process. The chemical etching has advantages such as a high etch rate and a lower cost of the equipment used for the process. Chemical etching, however, is disadvantageous in that because the etching processed by the chemical etching is isotropic which often accompanies side etching, the reproducibility of the pattern becomes rather poor due to the side etching.

In the above-mentioned reactive ion etching process, the etch rate of the ferroelectric substance is low because it has only a low reactivity with the etching gas, and a ratio of the etch rate of the material to that of the photoresist (selective ratio) is also small. Therefore, devices configured with the ferroelectric substance, in particular, those having a film thickness of the ferroelectric substance of several $\mu m$, such as pyroelectric device and piezoelectric device, require more than one hour for the etching process. Thus, the reactive ion etching process suffers from a disadvantage that the photoresist layer is completely removed by the etching by the end of the process of etching on the ferroelectric substance film. As a result, the ferroelectric substance film is damaged and the device cannot demonstrate a satisfactory performance.

In the processes of the sputter etching and the reactive ion etching, since an electrode of an etching equipment is usually insulated from a sample to be etched by a quartz plate having a thickness of several mm, cooling efficiency of cooling water on the rear face of the electrode is not satisfactory. As a result, the processes suffer from a disadvantage that the photoresist layer is sometimes baked down by a rise in the sample temperature.

In order to cope with this problem, a means is taken for raising the cooling efficiency by applying a vacuum grease between the sample and the electrode. The application of the grease however takes much time and has problems such as outflow of the grease if the area of the sample is small, and possible contamination by the grease.

In the method of chemical etching of the ferroelectric substances represented by perovskite oxide, the conventional process of using only the known etchant has a problem of a residue on the substrate or the electrode. The method also has the disadvantage of poor reproducibility of the pattern due to possible side etching, forming a pattern with a tapered cross-sectional shape.

SUMMARY OF THE INVENTION

The primary objects of the present invention are to overcome the above-mentioned disadvantages, to solve the problems inherent to the prior art, and to provide a method for fabricating a dielectric device finished in a fine pattern by chemical etching without any residue, associated with an excellent pattern reproducibility.

Another object of the present invention is to provide a method for fabricating a dielectric device which is finished in a fine pattern by sputter etching a metal electrode film formed on and/or underneath a dielectric substance film without producing a substantial damage on a photoresist layer.

The present invention provides a method for fabricating a dielectric device comprising the steps of:

(a) providing a substrate having a dielectric substance film disposed thereon, (b) etching the dielectric substance film to form a predetermined pattern with an etchant comprised of hydrofluoric acid and an oxidizing agent, and (c) removing residues resulting from the etching by treating the etched layer with a first treating solution containing a reducing agent and subsequently with a second treating solution containing an acid.

In a preferred mode of the present invention, the method for fabricating a dielectric device further comprising the steps of:

(d) forming an upper metal electrode film on the dielectric substance film, (e) providing an insulating sheet of a resin containing at least one of chlorine atom and fluorine atom between said substrate and an electrode of a sputter etching equipment for supporting the substrate, and (f) patterning the upper metal electrode film by sputter etching in the sputter etching equipment prior to the step (b).

In another preferred mode of the present invention, the upper metal electrode film is made of platinum, palladium or gold, and the patterned upper metal electrode film by the step (f) is used as a mask in the step (b).

In still another preferred mode of the present invention, the substrate has a lower metal electrode film under the dielectric substance film and the lower electrode film is patterned by the sputter etching applied to patterning of the upper metal electrode film.

In the present invention, it is preferable that the dielectric substance is a ferroelectric substance selected from the group consisting of lead titanates, lead zirconates, lead-zirconium titanates, barium titanates, strontium titanates and strontium-barium titanates.

In a preferred mode of the present invention, the oxidizing agent in the above-mentioned etchant is at least one member selected from the group consisting of potassium permanganate, potassium dichromate, manganese dioxide, hydrochloric acid, sulfuric acid and nitric acid.

In a further preferred mode of the present invention, the concentration of hydrofluoric acid in the above-mentioned etchant is from 0.1 mol/L to 15 mol/L, and the molar ratio of the hydrofluoric acid to the above-mentioned oxidizing agent is from 0.05 to 2,000.

In still another preferred mode of the present invention, the reducing agent in the above-mentioned first treating solution is at least one member selected from the group consisting of hydrogen peroxide, oxalic acid, formaldehyde, potassium iodide, sulfurous acid and tin (II) chloride.

In a further preferred mode of the present invention, the concentration of the reducing agent in the above-mentioned first treating solution is from 0.1 mol/L to 12 mol/L.

In still another preferred mode of the present invention, the acid in the above-mentioned second treating solution is at least one member selected from the group consisting of hydrochloric acid, acetic acid, sulfuric acid and nitric acid.

In a further preferred mode of the present invention, the concentration of the acid in the above-mentioned second treating solution is from 1.0 mol/L to 12 mol/L.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all of the Figures are schematic representations for purposes of illustration and do not necessarily depict the actual relative sizes or locations of the elements shown.

DETAILED DESCRIPTION OF THE PREFERRED EMBODIMENTS

In the following paragraphs, the method of fabricating the dielectric device in accordance with the present invention will be described in more detail with reference to its preferred embodiments.

EXAMPLE 1

Figure 1:
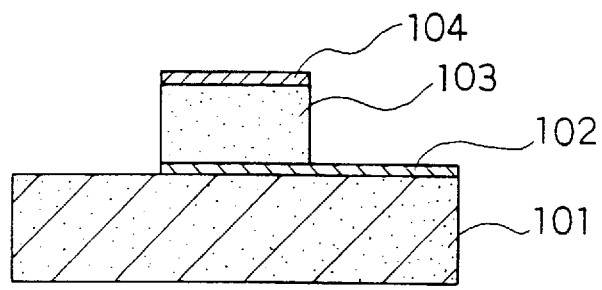
FIG. 1 is a cross-sectional view showing a dielectric device obtained in accordance with Example 1 of the present invention.
Figure 2:
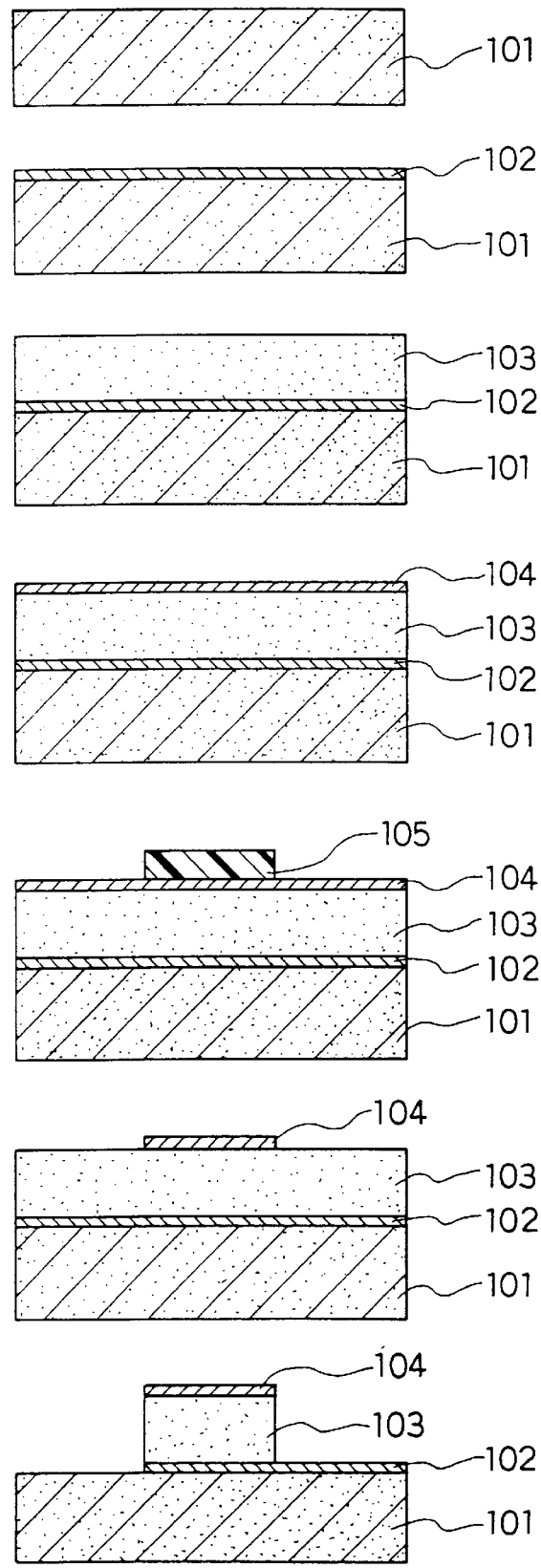
FIG. 2 is a cross-sectional view showing a fabricating process of the shown dielectric device.

FIG. 1 is a cross-sectional view showing the dielectric device obtained by this example, and FIG. 2 shows its fabricating process.

On an insulating substrate 101 composed of a single crystal of MgO and having a thickness of 500 $\mu$m, a first (lower) metal electrode film 102 composed of a Pt thin film was formed by means of an RF-magnetron sputtering method. Film deposition conditions applied to the Pt thin film were: a substrate temperature of 600° C.; a sputtering gas of a mixture of argon (95%) and oxygen (5%) at a pressure of 0.5 Pa; a power density of injected high frequency of 2.5 W/cm$^2$ (13.56 MHz); and a film deposition time of 1 hour. A thickness of the obtained film was 0.15 $\mu$m.

Subsequently, a dielectric film 103 having a composition of $Pb_{0.9}La_{0.1}Ti_{0.975}O_3$ was formed on the above-mentioned first metal electrode film 102. The method employed for the film-forming was as follows.

For forming the thin film of $Pb_{0.9}La_{0.1}Ti_{0.975}O_3$, an RF-magnetron sputtering apparatus was used. The substrate 101 was mounted on a substrate holder made of stainless steel and set on the apparatus. A mixture of PbO powder, $La_2O_3$ powder and $TiO_2$ powder was used as a target. The mixture was placed in a copper dish and set on the apparatus. The above-mentioned powders were mixed by adjusting the amount of PbO excessive by 20 mol %, compared with that in the film composition.

Film deposition conditions for the dielectric film were: a substrate temperature of 600° C.; a sputtering gas of a mixture of argon (90%) and oxygen (10%) at a pressure of 0.9 Pa; and a power density of injected high frequency of 2.0 W/cm$^2$ (13.56 MHz). A thickness of the obtained film was 3 $\mu$m.

On the above-mentioned dielectric film 103, a second (upper) metal electrode film 104 composed of Pt thin film was further formed. The method of forming the second metal electrode film 104 was similar to that applied to the first metal electrode film 102.

Then, after forming a mask pattern with a photoresist layer 105 having a thickness of 3 $\mu$m on the second metal electrode film 104, a patterning was performed on the second metal electrode film 104 by sputter etching.

Figure 3:
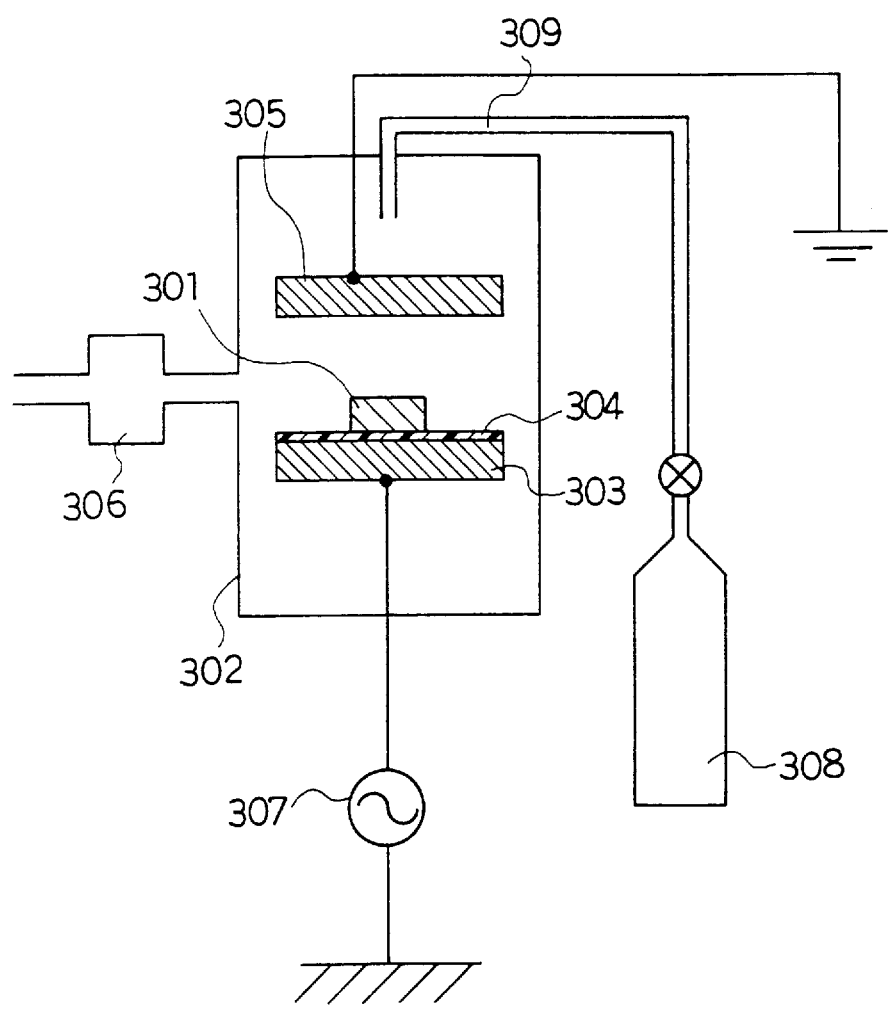
FIG. 3 is a cross-sectional view showing a schematic configuration of a sputter etching equipment used in one embodiment of the present invention.

FIG. 3 shows a schematic configuration of the sputter etching equipment. In this figure, numeral 302 represents a reaction chamber. In this chamber, there are disposed a disc electrode 303 for applying a high frequency voltage having a diameter of 10 inches and a counter electrode 305. The high frequency applying electrode 303 is connected to a high frequency power source 307 and applied with a high frequency voltage at 13.56 MHz.

The high frequency applying electrode 303 is so designed as to be cooled with water at its rear face. A gas supplying unit 308 is connected to the chamber 302 through a gas supplying pipe 309 the end of which is open in the chamber 302. An exhaust system 306 is also installed. A sample 301 to be etched is disposed on an insulating sheet 304 of 0.1 mm thickness adhered onto the high frequency applying electrode 303. For the insulating sheet, a polyvinyl chloride resin sheet or a polyfluorocarbon resin sheet is used.

Under conditions of a vacuum of 0.06 Torr, an Ar gas flow rate of 10 sccm, and a plasma power of 170 W, the second metal electrode film 104 was etched in a predetermined pattern. It took 15 minutes for the etching. In the etching, since the insulating sheet for separating the sample 301 to be etched from the electrode 303 was a thin resin sheet 304, the cooling effect on the sample 301 to be etched was sufficiently high. This completely excluded baking down of the photoresist layer. Further, the resin containing chlorine atoms or fluorine atoms serves as a protecting film during the etching process because the substances redeposited on the surface of the photoresist layer during the etching have a resistant property against the plasma. This is also advantageous for avoiding disappearance of the photoresist layer due to a damage induced by plasma during etching for long hours.

For instance, under the conditions of a vacuum of 0.06 Torr, an Ar gas flow rate of 10 sccm and a plasma power of 170 W, the etch rate of the photoresist (positive resist) was 0.065 $\mu$m/min if the insulating sheet was a polyvinyl chloride film (thickness: 0.1 mm). This value was ½ or less, as compared with the etch rate of 0.15 $\mu$m/min with the photoresist layer when a normal quartz plate (thickness: 1 mm) was used as the insulating sheet.

During the sputter etching process, an organic substance was produced from the insulating sheet on the high frequency applying electrode of the equipment by the sputter etching. Therefore, an environment in the chamber includes excessive organic substance. Thus, the environment in the chamber is less likely to be affected by the number of samples and the area for etching because of the presence of excessive organic substance and remains substantially constant. As a result, the influence of a so-called "loading effect" is small, and a uniform etching can be performed.

Then, sample number-dependencies of the etch rates of the second metal electrode film 104, i.e., Pt film were measured for the polyvinyl chloride sheet (thickness: 0.1 mm) and the quartz plate (thickness: 1 mm), respectively. As the sample to be etched, one or eight sheets of square substrate (20 mm) were used. The results are summarized in Table 1 below. As clearly shown in Table 1, the etch rate of the Pt film is constant irrespective of the number of the substrates if the polyvinyl chloride resin sheet was used as the insulating sheet. In contrast, the etch rate varied greatly by the number of the substrates if the quartz plate was used as the insulating sheet.

TABLE 1

Etching Rate of Pt Film

|  | Polyvinyl chloride Sheet | Quartz Plate |
| --- | --- | --- |
| Number of Substrate: 1 | 0.021 $\mu$m/min | 0.018 $\mu$m/min |
| Number of Substrate: 3 | 0.021 $\mu$m/min | 0.012 $\mu$m/min |

Next, the dielectric thin film 103 was patterned in a chemical etching process by utilizing the second metal electrode film 104 which had been patterned in the above-mentioned manner as a mask for the patterning. In the process, an etchant prepared by adding 1.25 mol/L of potassium dichromate as an oxidizing agent to 5 mol/L of hydrofluoric acid was used. Then, after immersing the etched substrate in a first treating solution prepared by mixing an aqueous solution of 35 wt % sulfurous acid with 99.7 wt % of acetic acid at a volumetric ratio of 1:5 for 0.2–3 minutes, it was immersed in a second treating solution composed of 5 mol/L of hydrochloric acid for 0.2–3 minutes, thereby to completely remove the etching residues.

Finally, after forming a mask pattern on the first metal electrode film 102 with a photoresist layer, it was patterned by sputter etching. In this manner, a dielectric substance device as shown in FIG. 1 was produced.

EXAMPLE 2

Figure 4:
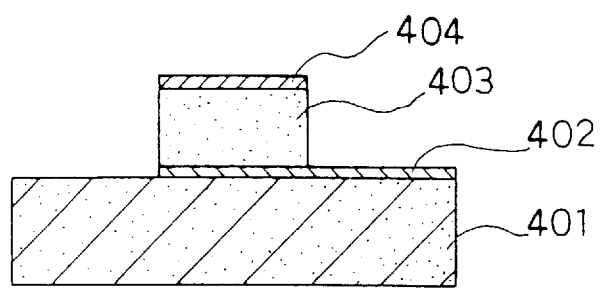
FIG. 4 is a cross-sectional view showing a dielectric device obtained in accordance with Example 2 of the present invention.
Figure 5:
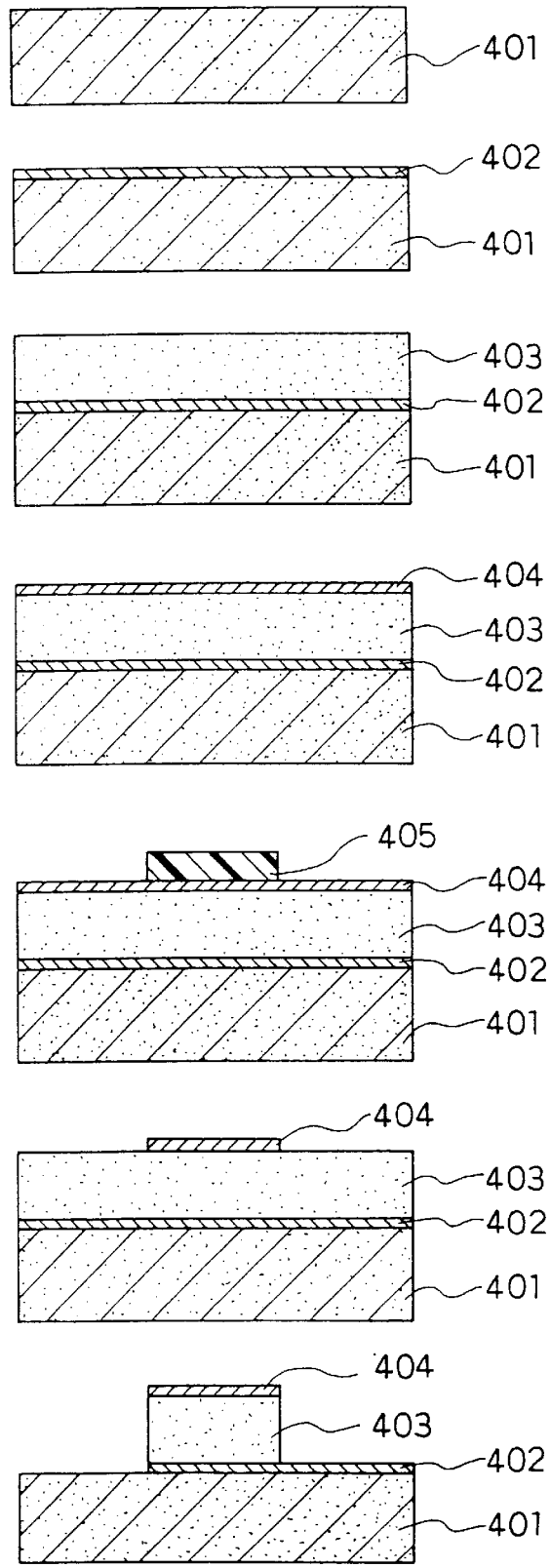
FIG. 5 is a cross-sectional view showing a fabricating process of the shown dielectric device.

FIG. 4 is a cross-sectional view showing a dielectric device obtained by this example, and FIG. 5 shows its fabricating process.

As a substrate 401, a single crystal of MgO having a thickness of 500 $\mu$m was used. On this substrate 401, a first metal electrode film 402 composed of Pt thin film having a thickness of 0.15 $\mu$m was formed by means of RF-magnetron sputtering in a manner similar to that of Example 1.

Subsequently, a dielectric substance film 403 having a composition of $PbZr_{0.55}Ti_{0.45}O_3$ was formed on the above-mentioned first metal electrode film 402. For the film deposition, an RF-magnetron sputtering apparatus was used. The substrate 401 was mounted on a substrate holder made of stainless steel and set on the apparatus. A mixture of PbO powder, $TiO_2$ powder and $ZrO_2$ powder prepared by mixing the above-mentioned powders so as to adjust the amount of PbO excessive by 20 mol %, compared to that in the film composition, was used as a target. The mixture was placed in a copper dish and set on the apparatus. Film deposition conditions for the dielectric film were: a substrate temperature of 650° C.; a sputtering gas of a mixture of argon (90%) and oxygen (10%) at a pressure of 0.9 Pa; and a power density of injected high frequency of 2.0 W/cm$^2$ (13.56 MHz). A thickness of the obtained film was 3 $\mu$m.

On the above-mentioned dielectric film 403, a second metal electrode film 404 composed of Pt thin film was formed in a manner similar to that in Example 1. Then, after forming a mask pattern with a photoresist layer 405 on the second metal electrode film 404, a patterning was performed on the second metal electrode film 404 by sputter etching in a manner similar to that in Example 1.

Next, the dielectric thin film 403 was patterned in a chemical etching process by utilizing the second metal electrode film 404 which had been patterned in the above-mentioned manner as a mask. In the process, an etchant prepared by adding one of oxidizing agents which will be described later to hydrofluoric acid was used. Then, after immersing the etched substrate in a first treating solution prepared by mixing an aqueous solution of 35 wt % sulfurous acid with 99.7 wt % of acetic acid at a volumetric ratio of 1:5 for 0.2–3 minutes, it was immersed in a second treating solution composed of 5 mol/L of hydrochloric acid for 0.2–3 minutes, thereby to completely remove the etching residues.

Subsequently, the first metal electrode film 401 was also patterned in a manner similar to that in Example 1, thereby to produce a dielectric device as shown in FIG. 4.

The oxidizing agents to be added to the etchant used in etching the dielectric substance were selected from the group consisting of potassium permanganate, potassium dichromate, manganese dioxide, hydrochloric acid, sulfuric acid and nitric acid. The total volume of the etchant was fixed to 200 ml and the content of the hydrofluoric acid was fixed to 0.78 mole, and the concentration of the oxidizing agent was varied for the test. The relationships between the molar ratio of the hydrofluoric acid to the oxidizing agent and the etch rate of the dielectric film are summarized in Table 2 below. Without addition of any oxidizing agent to the etchant, the etch rate of the dielectric film was 0.001 $\mu$m/min.

TABLE 2

Etching Rate of Dielectric Substance

| | Molar ratio (Hydrofluoric acid/Oxidizing agent) | | | | | | | | |
|---|---|---|---|---|---|---|---|---|---|
| Oxidizing agent | 0 | 0.05 | 1 | 5 | 10 | 100 | 1000 | 2000 | 10000 |
| Potassium permanganate | 0.001 | 2.6 | 2.6 | 3.0 | 3.6 | 4.0 | 3.0 | 0.3 | 0.1 |
| Potassium dichromate | 0.001 | 2.6 | 2.6 | 2.6 | 3.0 | 3.0 | 2.4 | 0.3 | 0.1 |
| Manganese dioxide | 0.001 | 2.4 | 2.4 | 2.4 | 2.4 | 1.8 | 1.2 | 0.3 | 0.1 |
| Hydrochloric acid | 0.001 | 1.9 | 0.9 | 0.7 | 0.6 | 0.5 | 0.3 | 0.2 | 0.1 |
| Sulfuric acid | 0.001 | 0.15 | 0.4 | 0.3 | 0.2 | 0.2 | 0.2 | 0.2 | 0.1 |
| Nitric acid | 0.001 | 2.1 | 1.6 | 1.2 | 0.7 | 0.5 | 0.3 | 0.2 | 0.1 |

From Table 2, it is appreciated that the etch rate of the dielectric substance is greatly improved by the addition of the oxidizing agent to the etchant, and, in particular, an improvement in the etch rate is observed at a molar ratio of the hydrofluoric acid constituting the etchant to the oxidizing agent of 0.05 or larger and 2,000 or smaller.

By using the hydrofluoric acid containing an oxidizing agent as described above, it is possible to shorten the etching process, and to reduce the rate of damaged photoresist layer by the etchant. Further, since the amount of side etching is decreased, it is possible to improve the reproducibility of the pattern.

Figure 6:
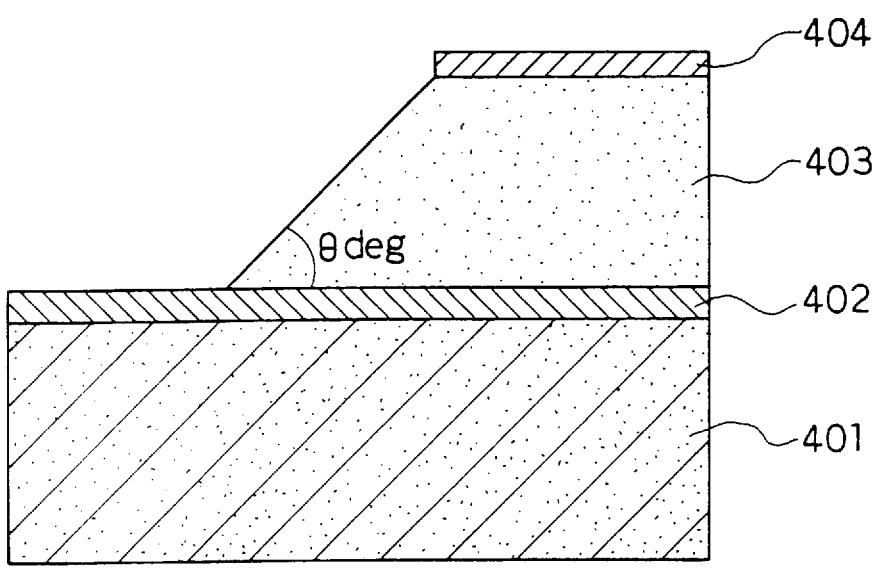
FIG. 6 is a cross-sectional view showing a tapering angle of the pattern profile of the dielectric substance film.
Figure 7:
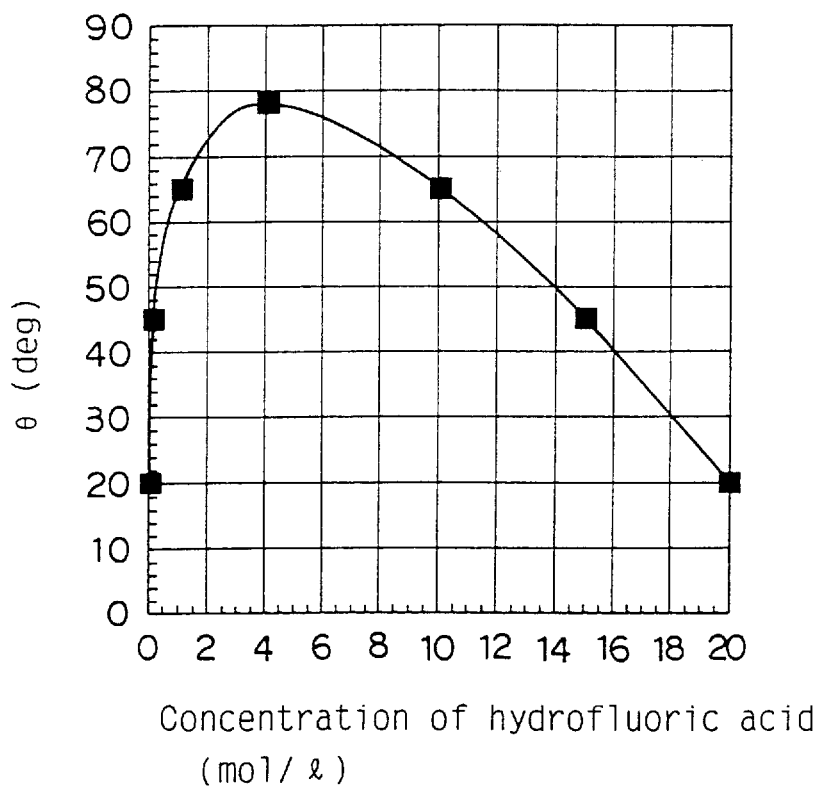
FIG. 7 is a diagram representing the relationship between the tapering angle of the dielectric substance film pattern etched in accordance with Example 2, and the concentration of hydrofluoric acid in the etchant used in Example 2.

In addition, for clarifying an optimum amount of the hydrochloric acid in the etchant, the relationship was examined between the tapering angle of the pattern profile of the dielectric film and the concentration of the hydrochloric acid in the etchant. Diagram in FIG. 7 shows the results when manganese dioxide is used as the oxidizing agent at a molar ratio of 4 of the hydrofluoric acid to the oxidizing agent. FIG. 6 illustrates a definition of the tapering angle of the profile of the dielectric film pattern.

From FIG. 7, it is appreciated that the tapering angle of the profile of the dielectric film pattern is larger than 45 degrees and appropriate for producing the dielectric devices if the molar concentration of the hydrofluoric acid constituting the etchant is 0.1 mol/L or more and 15 mol/L or less. In particular, if the molar concentration of the hydrofluoric acid is from 1 mol/L to 10 mol/L, the tapering angle of the profile of the dielectric film pattern is larger than 65 degrees and the side wall of the dielectric film is cut more upright. This is preferable from the viewpoint of the reproducibility of the pattern.

Further, when the oxidizing agents constituting the etchant are other oxidizing agents listed in Table 2 than the manganese dioxide, the preferable concentration range of the hydrochloric acid is similar to that in the above-mentioned case.

EXAMPLE 3

Figure 8:
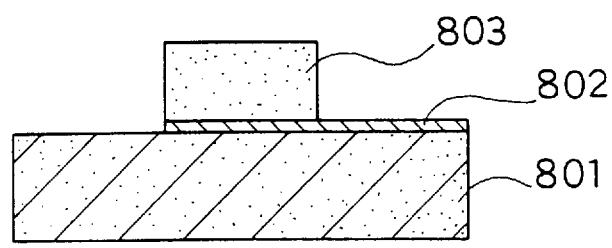
FIG. 8 is a cross-sectional view showing a dielectric device obtained in accordance with Example 3 of the present invention.
Figure 9:
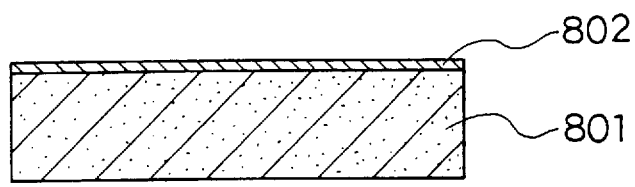
FIG. 9 is a cross-sectional view showing a fabricating process of the shown dielectric device.
Figure 9:
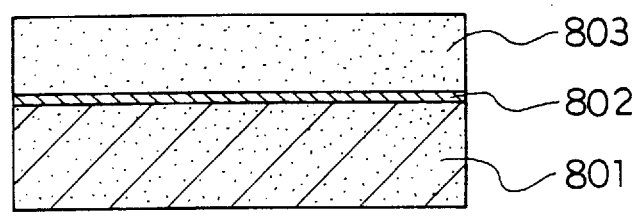
Figure 9:
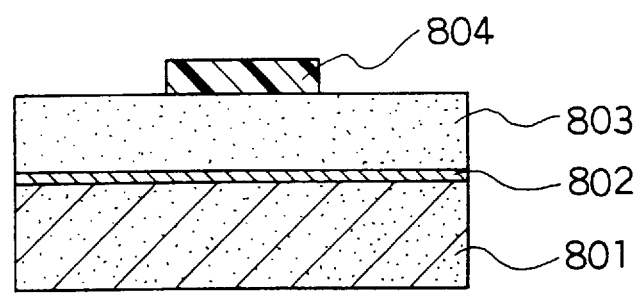
Figure 9:
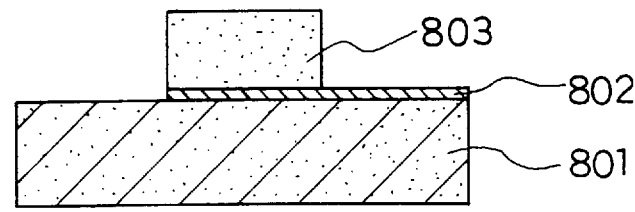

FIG. 8 is a cross-sectional view showing a dielectric device obtained by this example, and FIG. 9 shows its fabricating process.

As a substrate 801, a single crystal of MgO having a thickness of 500 $\mu$m was used. On this substrate 801, an electrode film 802 composed of Pt thin film was formed. On this electrode film 802, a dielectric substance film 803 having a composition of $PbTiO_3$ was formed. The electrode film 802 and the dielectric substance film 803 were produced by means of RF-magnetron sputtering in a manner similar to that of Example 1. For forming the dielectric substance film 803, a mixture of PbO powder and $TiO_2$ powder prepared by mixing the above-mentioned powders so as to adjust the amount of PbO excessive by 20 mol %, compared with that in the film composition, was used as a target. A thickness of the obtained dielectric film 803 was 3 $\mu$m.

Subsequently, after forming a photoresist layer 804 of the predetermined pattern on the dielectric thin film 803, it was patterned in a chemical etching process. In the process, an etchant prepared by adding potassium dichromate to an aqueous solution of hydrofluoric acid was used. The concentration of the hydrochloric acid was 5 mol/L and the molar ratio of the hydrofluoric acid to the potassium dichromate was 4.

Then, after immersing the etched substrate in a first treating solution comprising a reducing agent for 0.2–3 minutes, it was immersed in a second treating solution composed of 5 mol/L of hydrochloric acid for 0.2–3 minutes, thereby to completely remove the etching residues. Finally, the electrode film 802 was patterned by sputter etching.

As the reducing agent for constituting the first treating solution, one of hydrogen peroxide, oxalic acid, formaldehyde, potassium iodide, sulfurous acid and tin (II) chloride was used. Table 3 below summarizes the relationship between the concentration of these reducing agents and the state of the etched residue removal. In a range of the concentration of the reducing agent constituting the first treating solution of 0.05 mol/L or more and 5 mol/L or less, it is possible to pattern the dielectric substance film without producing any residue.

In a range of the concentration of the reducing agent from 0.1 mol/L to 1 mol/L, in particular, it is possible to remove the residue completely within one minute after immersing in the treating solution and to shorten the treatment. As a comparative experiment, an aqueous solution of typical oxidizing agent, potassium permanganate, was used as the first treating solution in place of the reducing agent, with an unfavorable result that a number of etching residues of the dielectric substance film were present on the substrate which were impossible to remove by the second treating solution.

TABLE 3

| Reducing agent | Molar concentration of the reducing agent in the first treating solution: A (mol/L) | | | | |
|---|---|---|---|---|---|
| | $0 < A < 0.05$ | $0.05 \leq A < 0.1$ | $0.1 \leq A < 1$ | $1 < A \leq 5$ | $5 < A$ |
| Hydrogen peroxide | X | ○ | ◉ | ○ | XX |
| Oxalic acid | X | ○ | ◉ | ○ | XX |
| Form-aldehyde | X | ○ | ◉ | ○ | XX |
| Sulfurous acid | X | ○ | ◉ | ○ | XX |
| Potassium iodide | X | ○ | ◉ | ○ | XX |
| Tin (II) chloride | X | ○ | ◉ | ○ | XX |

X: No disappearance of residue even after immersion of the substrate in the first treating solution for longer than 3 min.
○: Disappearance of residue after immersion for one min to 3 min.
◉: Disappearance of residue after immersion for 0.2 min to shorter than one min.
XX: No disappearance of residue even after immersion of the substrate in the first treating solution for longer than 3 min plus damage of the dielectric substance film.

EXAMPLE 4

Figure 10:
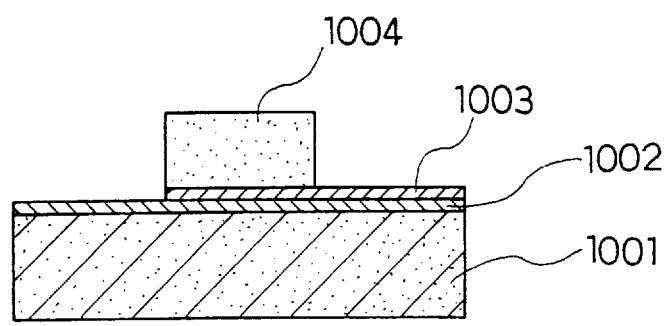
FIG. 10 is a cross-sectional view showing a dielectric device obtained in accordance with Example 4 of the present invention.
Figure 11:
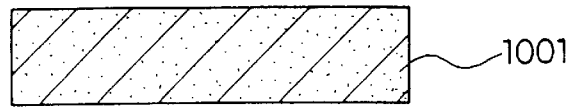
FIG. 11 is a cross-sectional view showing a fabricating process of the shown dielectric device.
Figure 11:
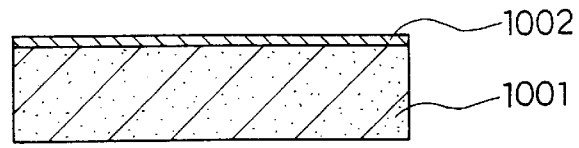
Figure 11:
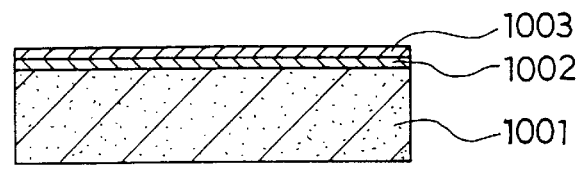
Figure 11:
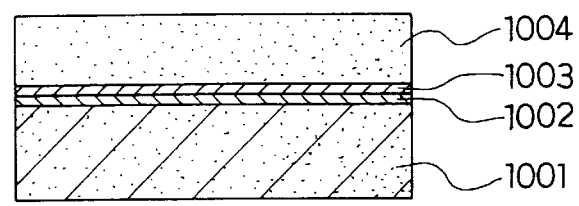
Figure 11:
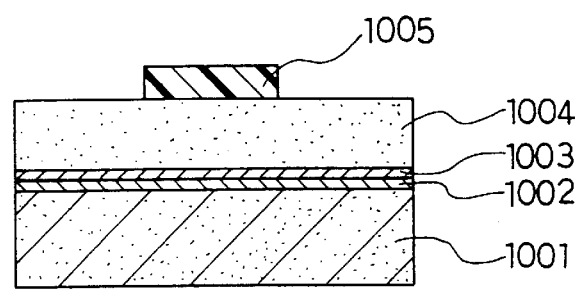
Figure 11:
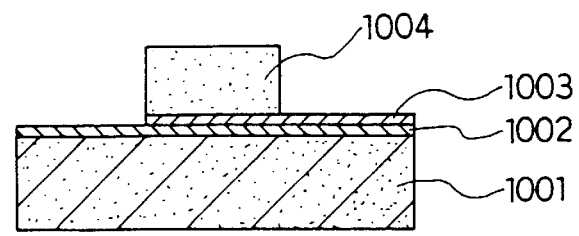

FIG. 10 is a cross-sectional view showing a dielectric device obtained by this example, and FIG. 11 shows its fabricating process.

On a substrate 1001 composed of a single crystal of Si and having a thickness of 500 μm, a diffusion preventing layer 1002 composed of Ti thin film was formed by means of RF-magnetron sputtering, and on this diffusion protecting layer 1002, a first metal electrode film 1003 composed of Pt thin film was formed under the same conditions as those in Example 1 by means of RF-magnetron sputtering. Film deposition conditions applied to the diffusion preventing layer 1002 were: a substrate temperature of 600° C.; a sputtering gas of argon at a pressure of 0.7 Pa; a power density of injected high frequency of 5.0 W/cm² (13.56 MHz); and a film deposition time of 5 minutes.

Subsequently, a dielectric substance film 1004 having a composition of BaTiO₃ or SrTiO₃ was formed on the above-mentioned first metal electrode film 1003. The method employed for forming the dielectric substance film was as follows.

As a target for forming the dielectric film of the composition of BaTiO₃, a sintered body having a composition of BaTiO₃ was used. The film deposition conditions for the sputtering were: a substrate temperature of 700° C.; a sputtering gas of a mixture of argon (50%) and oxygen (50%) at a pressure of 20 Pa; and a power density of injected high frequency of 2.0 W/cm² (13.56 MHz). A thickness of the obtained film was 3 μm.

As a target for forming the dielectric film of the composition of SrTiO₃, a sintered body having a composition of SrTiO₃ was used. The film deposition conditions for the sputtering were: a substrate temperature of 500° C.; a sputtering gas of a mixture of argon (80%) and oxygen (20%) at a pressure of 0.9 Pa; and a power density of injected high frequency of 2.0 W/cm² (13.56 MHz). A thickness of the obtained film was 3 μm.

Next, the dielectric substance film 1004 was patterned in a chemical etching process, after a mask of a predetermined pattern had been formed on the dielectric film with a photoresist layer 1005. In the chemical etching process, an etchant prepared by adding an oxidizing agent of potassium permanganate to hydrofluoric acid was used. The concentration of the hydrofluoric acid was 5 mol/L and the molar ratio of the hydrofluoric acid to the potassium permanganate was 5. Then, after immersing the etched substrate in a first treating solution prepared by mixing a 0.1 mol/L aqueous solution of potassium iodide with 99.7 wt % of acetic acid at a volumetric ratio of 1:5 for 0.2–3 minutes, it was immersed in a second treating solution for 0.2–3 minutes, thereby to completely remove the etching residues. Finally, after chemically removing the photoresist layer completely, the metal electrode film was patterned in a process step similar to that in Example 1. As the second treating solution, one of hydrochloric acid, acetic acid, sulfuric acid and nitric acid was used.

Table 4 below summarizes the relationships between the concentration of the acid employed and the state of the residue removal in the dielectric substance film 1004 of BaTiO₃. As shown in the table, in a range of the concentration of the acid constituting the second treating solution of 0.1 mol/L or more and 12 mol/L or less, it is possible to pattern the dielectric substance without producing any residue. In a range of the concentration of the acid from 1.0 mol/L to 6.5 mol/L, in particular, it was possible to remove the residue completely in a period shorter than one minute of immersion in the treating solution and to shorten the treatment. A result similar to the above-mentioned result is obtained with the dielectric substance film of SrTiO₃.

TABLE 4

| Acid | Molar concentration of the acid in the second treating solution: B (mol/L) | | | | |
|---|---|---|---|---|---|
| | $0 < B < 0.1$ | $0.1 \leq B < 1.0$ | $1.0 \leq B \leq 6.5$ | $6.5 \leq B \leq 12$ | $12 < B$ |
| Hydrochloric acid | X | ○ | ◉ | ○ | XX |
| Acetic acid | X | ○ | ◉ | ○ | XX |
| Sulfuric acid | X | ○ | ◉ | ○ | XX |
| Nitric acid | X | ○ | ◉ | ○ | XX |

X: No disappearance of residue even after immersion of the substrate in the first treating solution for longer than 3 min.
○: Disappearance of residue after immersion for one min to 3 min.
◉: Disappearance of residue after immersion for 0.2 min to shorter than one min.
XX: No disappearance of residue even after immersion of the substrate in the first treating solution for longer than 3 min plus damage of the dielectric substance film.

EXAMPLE 5

Figure 12:
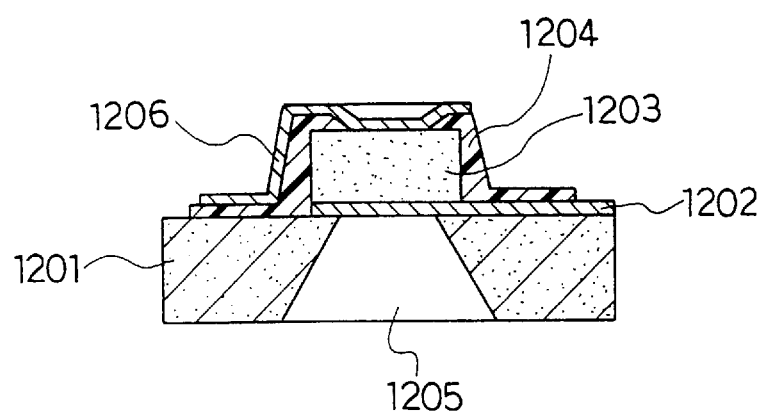
FIG. 12 is a cross-sectional view showing a pyroelectric infrared detector obtained in accordance with Example 5 of the present invention.
Figure 13:
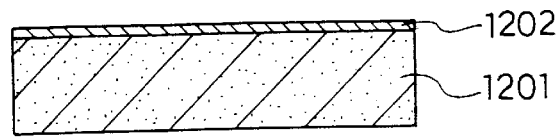
FIG. 13 is a cross-sectional view showing a fabricating process of the shown pyroelectric detector.
Figure 13:
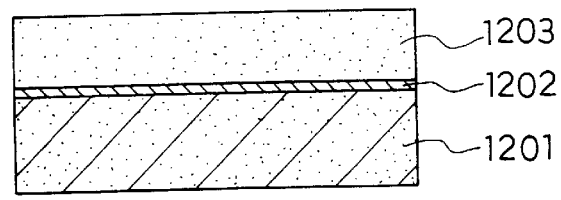
Figure 13:
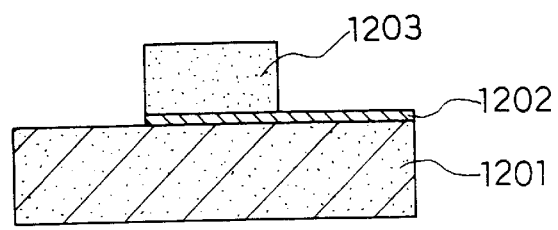
Figure 13:
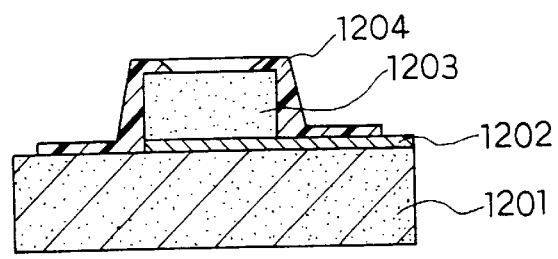
Figure 13:
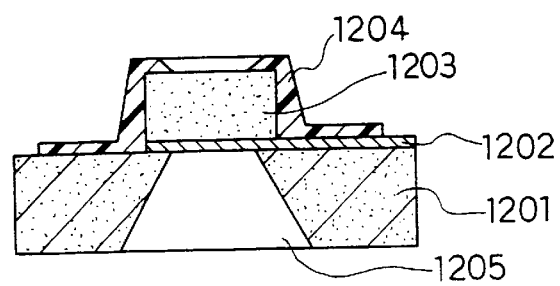
Figure 13:
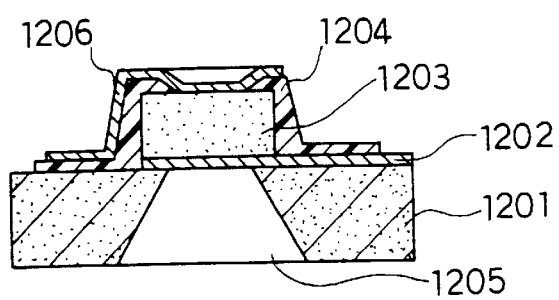

A description will be made on a fabricating process of a pyroelectric infrared detector as a specific example of the dielectric substance devices. FIG. 12 is a cross-sectional view showing a pyroelectric infrared detector obtained in this example, and FIG. 13 shows cross-sectional views of the fabricating process.

On a substrate 1201 composed of a single crystal of MgO having a thickness of 500 μm and being oriented to a face (100), a first metal electrode film 1202 composed of Pt thin film having a thickness of 1500 angstrom and oriented to the face (100) was formed. Subsequently, a pyroelectric substance film 1203 having a composition of $Pb_{0.9}La_{0.1}Ti_{0.970}O_3$ and a thickness of 3 μm, and being oriented to a face (001) was formed on the above-mentioned film. The methods for producing the first metal electrode film 1202 and the pyroelectric substance film 1203 were similar to those applied to the first metal electrode film 102 and the dielectric substance film 103 in Example 1, respectively.

The pyroelectric substance film 1203 was then patterned by a chemical etching process. In the process, an etchant prepared by adding nitric acid to 5 mol/L hydrofluoric acid at a molar ratio of the hydrofluoric acid to the nitric acid of 4 was used. As the first and second treating solutions, those used in Example 1 were used.

Next, the first electrode Pt film was patterned by a sputter etching process as described in Example 1. Thereafter, an insulating layer 1204 of an organic resin was formed on the entire surface of the substrate by applying a photo-sensitive polyimide resin by a spin coating process. After a contact hole was formed on the pyroelectric substance 1203 on the insulating layer 1204, the resin was cured.

Subsequently, by chemically etching the MgO single crystal plate as the substrate 1201 with an aqueous solution of orthophosphoric acid, thereby to form a substrate opening 1205 in the substrate 1201 so as to dispose the pyroelectric substance 1203 at an approximate center of the device. This step took about 5 hours. In this step, other part of the substrate than the opening had previously been applied with a resist substance to prevent the damage by the etching. Since the substrate opening was formed by an anisotoropical etching, the formed etching was tapered.

Finally, a light-receiving electrode 1206 composed of Ni-Cr thin film having a thickness of 150 angstrom was formed by a sputtering method on the organic insulating film 1204. A lead-out part of the light-receiving electrode 1206 was patterned by photolithography and its lead-out electrode was connected to the pyroelectric substance layer through the contact hole.

Lead titanate materials applied as the pyroelectric substance are difficult to effect patterning. Conventionally, in order to prepare the infrared detector from these materials, a metal mask has been used for patterning. Therefore, miniaturization of the detector has been difficult and the precision of the pattern has been unsatisfactory.

As detailedly described previously, by patterning the dielectric substance which serves as the pyroelectric substance according to the chemical etching in accordance with the present invention, a fine patterning is possible at a high precision. In this configuration, the Pt first electrode functions as a stopper layer against the etching action during the chemical etching of the pyroelectric substance. Therefore, a damage on the substrate does not occur by a possible excessive etching. As a result, cutting the lead-out electrode does not occur during the fabricating process. Further, since the Pt film is oriented to the face (100), it is possible to orient the pyroelectric substance to a polarized axis. This is effective from the viewpoint of enhancement of the sensitivity of the detector. Moreover, the present mode of chemical etching is advantageous in that it reduces the manufacturing cost because the first electrode functions as the etching stopper layer.

In this example, after providing the opening on the MgO substrate by etching, the infrared ray absorbing electrode was formed. This order of the steps is determined, taking into account the likeliness of disconnection of the first metal electrode due to relaxation of the stress on the pyroelectric substance resulting from partial removal of the substrate, and a damage on the electrode by the etchant. It is apparent however that no problem will occur by changing the order of the steps of producing the infrared ray absorbing electrode and providing the opening in the substrate, if the mechanical property of the organic insulating film and the resistant property of the electrode against the etchant are deliberately considered.

EXAMPLE 6

This example is similar to Example 1 except for the application of sputter etching in place of the chemical etching to the patterning of the dielectric substance film. The following description will therefore be made by referring to FIG. 1 and FIG. 2.

First, on a substrate 101 composed of a single crystal of MgO and having a thickness of 500 μm, a first metal electrode film 102 composed of Pt thin film having a thickness of 0.15 μm was formed. Subsequently, a dielectric substance film 103 of 3 μm thickness having a composition of $Pb_{0.9}La_{0.1}Ti_{0.975}O_3$ was formed on the above-mentioned first metal electrode film 102 by RF-magnetron sputtering.

On the above-mentioned dielectric film 103, a second metal electrode film 104 composed of Pt thin film was further formed. The method of forming the second metal electrode film 104 was similar to that applied to the first metal electrode film 102.

Then, after forming a mask pattern with a photoresist layer 105 having a thickness of 3 μm on the second metal electrode film 104, a patterning was performed on the second metal electrode film 104 by sputter etching.

Subsequently, the dielectric thin film 103 was patterned by the sputter etching process by utilizing the photoresist pattern formed again on the second metal electrode film 104 which had been patterned as a mask for the patterning. The etching equipment employed in the sputter etching of the electrode film shown in FIG. 3 was used here. The sample was set on an insulating sheet having a thickness of 0.1 mm provided on the electrode. As the insulating sheet, a sheet of polyvinyl chloride resin or polyfluorocarbon resin adhered to the high frequency applying electrode 303 was used.

The etching process was performed under the conditions of a vacuum of 0.06 Torr, an Ar gas flow rate of 10 sccm and a plasma power of 170 W. Etching period was 90 minutes. Since the insulating sheet is a thin resin sheet, the cooling effect of the etching sample is satisfactorily high. This avoids baking down of the photoresist layer. Further, the resin containing chlorine atoms or fluorine atoms used here serves as a protecting film during the etching process because the substances redeposited on the surface of the photoresist layer during the etching have a resistant property against the plasma. This is advantageous for preventing disappearance of the photoresist layer due to a damage by plasma, even if the etching was continued for a long period of time, e.g., for 90 minutes.

On the other hand, when a quartz plate having a thickness of 1 mm is used as the insulating sheet, the etching of $Pb_{0.9}La_{0.1}Ti_{0.975}O_3$ took 150 minutes under the same conditions of 10 sccm for the Ar gas flow rate and 170 W for the plasma power. In addition, the photoresist layer completely disappeared by the end of the etching process.

Finally, by patterning the first metal electrode film 102 by sputter etching, a dielectric substance device was produced.

In the foregoing examples, although MgO single crystal plate or Si single crystal plate is employed as the material for the substrate, a similar technical advantage is obtained by using another single crystal plate, a glass substrate, stainless steel plate, and the like.

One of $Pb_{0.9}La_{0.1}Ti_{0.975}O_3$, $PbZr_{0.55}Ti_{0.45}O_3$, $PbTiO_3$, $BaTiO_3$ and $SrTiO_3$ is employed for the dielectric substance and film-forming is performed by the RF-sputtering method in the foregoing examples. It is apparent however that the present invention can also provide a similar technical advantage with respect to a dielectric substance other than the exemplified ferroelectric substance and a dielectric substance film formed by any other method represented by CVD method, sol-gel method and the like.

Apart from the first and/or second metal electrode films of Pt thin film employed in the foregoing examples, a film of Au or Pd can also be used. These metal electrode films also serve as a mask in the patterning of the dielectric substance film by chemical etching.

As described previously, according to the present invention, it is possible to obtain a finely patterned dielectric substance device without producing any residue. In addition, by employing a resin sheet containing chlorine atoms or fluorine atoms for insulating the sample to be etched from the electrode of the etching equipment, it is possible to perform sputter etching without causing a great damage on the photoresist layer.

It is understood that various other alterations and modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for fabricating a dielectric device comprising the steps of:
    (a) providing a substrate having a dielectric substance film disposed thereon,
    (b) etching said dielectric substance film to form a pattern with an etchant comprised of hydrofluoric acid and an oxidizing agent, and
    (c) removing residues resulting from the etching by treating the etched layer with a first treating solution containing a reducing agent and subsequently with a second treating solution containing an acid.

2. The method for fabricating a dielectric device in accordance with claim 1, further comprising the steps of:
    (d) forming an upper metal electrode film on said dielectric substance film,
    (e) providing an insulating sheet of a resin containing at least one of chlorine atom and fluorine atom between said substrate and an electrode of a sputter etching equipment for supporting said substrate, and
    (f) patterning said upper metal electrode film by sputter etching in said sputter etching equipment prior to the step (b).

3. The method for fabricating a dielectric device in accordance with claim 2, wherein said upper metal electrode film is made of Pt, Au or Pd, and wherein the patterned upper metal electrode film by the step (f) is used as a mask in the step (b).

4. The method for fabricating a dielectric device in accordance with claim 1, wherein said dielectric film is at least one ferroelectric substance selected from the group consisting of lead titanates, lead zirconates, lead-zirconium titanates, barium titanates, strontium titanates and strontium-barium titanates.

5. The method for fabricating a dielectric device in accordance with claim 4, wherein the oxidizing agent in said etchant is at least one member selected from the group consisting of potassium permanganate, potassium dichromate, manganese dioxide, hydrochloric acid, sulfuric acid and nitric acid.

6. The method for fabricating a dielectric device in accordance with claim 5, wherein the concentration of hydrofluoric acid in said etchant is from 0.1 mol/L to 15 mol/L, and the molar ratio of the hydrofluoric acid to the oxidizing agent is from 0.05 to 2,000.

7. The method for fabricating a dielectric device in accordance with claim 6, wherein the concentration of hydrofluoric acid in said etchant is from 1 mol/L to 10 mol/L.

8. The method for fabricating a dielectric device in accordance with claim 4, wherein the reducing agent in the first treating solution is at least one member selected from the group consisting of hydrogen peroxide, oxalic acid, formaldehyde, potassium iodide, sulfurous acid and tin (II) chloride.

9. The method for fabricating a dielectric device in accordance with claim 8, wherein the concentration of the reducing agent in the first treating solution is from 0.05 mol/L to 5 mol/L.

10. The method for fabricating a dielectric device in accordance with claim 9, wherein the concentration of the reducing agent in the first treating solution is from 0.1 mol/L to 1 mol/L.

11. The method for fabricating a dielectric device in accordance with claim 4, wherein the acid in the second treating solution is at least one member selected from the group consisting of hydrochloric acid, acetic acid, sulfuric acid and nitric acid.

12. The method for fabricating a dielectric device in accordance with claim 11, wherein the concentration of the acid in the second treating solution is from 0.1 mol/L to 12 mol/L.

13. The method for fabricating a dielectric device in accordance with claim 12, wherein the concentration of the acid in the second treating solution is from 1.0 mol/L to 6.5 mol/L.

14. A method for fabricating a dielectric device comprising the steps of:
    (a) providing a substrate having a lower metal electrode film disposed thereon and a dielectric substance film overlying said lower metal electrode film,
    (b) etching said dielectric substance film to form a pattern with an etchant comprised of hydrofluoric acid and an oxidizing agent, and
    (c) removing residues resulting from the etching by treating the etched layer with a first treating solution containing a reducing agent and subsequently with a second treating solution containing an acid.

15. The method for fabricating a dielectric device in accordance with claim 14, further comprising the steps of:
    (d) forming an upper metal electrode film on said dielectric substance film,
    (e) providing an insulating sheet of a resin containing at least one of chlorine atom and fluorine atom between said substrate and an electrode of a sputter etching equipment for supporting said substrate, and (f) patterning said upper metal electrode film by sputter etching in said sputter etching equipment prior to the step (b).

16. A method for fabricating a dielectric device comprising the steps of;
   (a) providing a substrate having a dielectric substance film disposed thereon,
   (b) providing an insulating sheet of a resin containing at least one of chlorine atom and fluorine atom between said substrate and an electrode of a sputter etching equipment for supporting said substrate, and
   (c) patterning said dielectric substance film by sputter etching in said sputter etching equipment.

17. The method for fabricating a dielectric device in accordance with claim 16, further comprising the steps of;
   (d) forming an upper metal electrode film on said dielectric substance film,
   (e) providing an insulating sheet of a resin containing at least one of chlorine atom and fluorine atom between said substrate and an electrode of a sputter etching equipment for supporting said substrate, and
   (f) patterning said upper metal electrode film by sputter etching in said sputter etching equipment prior to the step (c).

* * * * *